US008541163B2

(12) United States Patent
Yamaguchi

(10) Patent No.: US 8,541,163 B2
(45) Date of Patent: Sep. 24, 2013

(54) TRANSPORTING METHOD, TRANSPORTING APPARATUS, EXPOSURE METHOD, AND EXPOSURE APPARATUS

(75) Inventor: Maiko Yamaguchi, Kamakura (JP)

(73) Assignee: Nikon Corporation, Tokyo (JP)

( * ) Notice: Subject to any disclaimer, the term of this patent is extended or adjusted under 35 U.S.C. 154(b) by 316 days.

(21) Appl. No.: 12/769,965

(22) Filed: Apr. 29, 2010

(65) Prior Publication Data
US 2010/0310993 A1 Dec. 9, 2010

Related U.S. Application Data

(60) Provisional application No. 61/213,424, filed on Jun. 5, 2009.

(51) Int. Cl.
*G03F 7/20* (2006.01)

(52) U.S. Cl.
USPC .......................................... 430/322; 430/30

(58) Field of Classification Search
USPC ............... 430/322, 30; 226/1, 2, 188, 174, 226/95; 198/617; 355/53
See application file for complete search history.

(56) References Cited

U.S. PATENT DOCUMENTS

| 1,957,621 | A | 5/1934 | Styron |
| 5,943,113 | A | 8/1999 | Ichihashi |
| 2006/0066715 | A1 | 3/2006 | Fukui |
| 2010/0116155 | A1 | 5/2010 | Yoshida |

FOREIGN PATENT DOCUMENTS

| JP | 11-119180 | 4/1999 |
| JP | 2006-098718 | 4/2006 |
| WO | WO 2006/036018 A1 | 4/2006 |
| WO | WO 2006/036019 A2 | 4/2006 |

OTHER PUBLICATIONS

English-language Translation of JP 11-119180, published on Apr. 30, 1999.
English-language Translation of JP 2006-098718, published on Apr. 13, 2006.
International Search Report, from the European Patent Office in corresponding International Application No. PCT/JP2010/059292, mailed Nov. 30, 2010.
Written Opinion of the International Searching Authority issued in corresponding International Application No. PCT/JP2010/059292, mailed Nov. 30, 2010.

*Primary Examiner* — Kathleen Duda
*Assistant Examiner* — Caleen Sullivan
(74) *Attorney, Agent, or Firm* — Finnegan, Henderson, Farabow, Garrett & Dunner, LLP

(57) ABSTRACT

A ladder type stage apparatus that transports a film-shaped substrate includes a plurality of rods whose longitudinal directions are aligned in a direction that is orthogonal to the moving direction of the film-shaped substrate in order to support the film-shaped substrate; chains that join the rods along a closed-loop trajectory; and a drive motor that moves the rods along this loop-shaped trajectory via the chains.

5 Claims, 10 Drawing Sheets

TRANSPORTING METHOD, TRANSPORTING APPARATUS, EXPOSURE METHOD, AND EXPOSURE APPARATUS

CROSS-REFERENCE TO RELATED APPLICATION

This application is a non-provisional application claiming priority to and the benefit of U.S. provisional application 61/213,424, filed Jun. 5, 2009. The entire contents of which are incorporated herein by reference.

BACKGROUND

1. Field of the Invention

The present invention relates to a transportation technique for transporting, for example, elongated film-shaped members which is flexible, and to an exposure technique and a manufacturing technique that utilize the transportation technique. The present invention also relates to a device manufacturing technique that utilizes this exposure technique and manufacturing technique.

2. Description of Related Art

In an exposure apparatus that is used for manufacturing an element such as a semiconductor element or liquid crystal display element, a typical exposure object has conventionally been a flat plate-shaped object which has high rigidity such as a semiconductor wafer or a glass substrate which have been coated with photoresist. Recently, in order to efficiently manufacture devices having a large area, an elongated film-shaped member which is flexible and can be stored by being wound up into a roll shape have been used as an exposure object. Note that in the present specification, for the exposure, in addition to a technique exposing an object by exposure light via a mask pattern and a projection optical system, a technique drawing a predetermined pattern onto the object by a charged particle beam such as an electron beam may also be employed.

In order to expose a predetermined pattern onto this elongated film-shaped member, conventionally, stretching the film-shaped member between two stationary rollers, and moving the film-shaped member continuously in a constant direction relative to the exposure area between the rollers in a state of keeping the tension of the film-shaped member constant (see, for example, Japanese Patent Application Publication No. 2006-098718 or the corresponding United States Patent Publication No. 2006/0066715).

In a conventional apparatus that exposes a film-shaped member, because the two rollers over which the film-shaped member is stretched are stationary and the film-shaped member moves while sliding over the top thereof, there is a possibility that the positional accuracy (i.e., the positioning accuracy relative to a target position over a time series) of the film-shaped member will be decreased due to vibration or the like. Due to this decrease in the positional accuracy, there is a possibility that the resolution of the pattern to be exposed will be decreased and that the overlay accuracy will also be decreased during overlay exposure.

SUMMARY

Aspects of the present invention were conceived in view of the above described circumstances, and have a purpose to transport, for example, an elongated film-shaped member which is flexible, along a target path with a high level of accuracy.

A transporting method according to a first aspect of the invention is a transporting method for transporting a film-shaped member that comprises: moving the film-shaped member in a moving direction along a surface of the film-shaped member; supporting a plurality of surface locations of the film-shaped member by a plurality of rod-shaped members whose longitudinal direction is aligned in a direction which intersects the moving direction, and which are lined up in the moving direction; and moving the plurality of rod-shaped members that are supporting the film-shaped member in synchronization in the moving direction.

An exposure method according to a second aspect of the invention is an exposure method for exposing a film-shaped member that comprises: moving the film-shaped member in a moving direction using a transporting method according to the first aspect of the invention; detecting an alignment mark that is formed on a portion to be exposed that is supported by the rod-shaped members from among the film-shaped component; and performing alignment of the portion to be exposed of the film-shaped member and a pattern of an exposed object based on a detection result of the alignment mark, and exposing the portion to be exposed that is supported by the rod-shaped members and is moving in the moving direction.

A manufacturing method according to a third aspect of the invention is a manufacturing method for adhering a first film-shaped member and a second film-shaped member that comprises: transporting the first film-shaped member using a transporting method according to the first aspect of the invention; transporting the second film-shaped member such that faces to the first film-shaped member, using the transporting method according to the first aspect of the invention; detecting alignment marks that are formed on a first portion and a second portion that are respectively supported by the rod-shaped members from among the first and second film-shaped members; and performing an alignment of the first portion and the second portion of the first and second film-shaped members based on a detection result of the alignment marks, and adhering the first portion and the second portion which are supported by the rod-shaped members and are moving in the moving direction.

A transporting apparatus according to a fourth aspect of the invention is a transporting apparatus that transports a film-shaped member that comprises: a plurality of rod-shaped members whose longitudinal direction is aligned in a direction which intersects a moving direction along a surface of the film-shaped member, and that line up in the moving direction in order to support the film-shaped member; and a drive apparatus that moves a plurality of the rod-shaped members that are supporting the film-shaped member from among the plurality of the rod-shaped members in synchronization in the moving direction.

An exposure apparatus according to a fifth aspect of the invention is an exposure apparatus that exposes a film-shaped member that includes: a transporting apparatus according the fourth aspect of the invention that transports the film-shaped member; a mark detection system that detects an alignment mark that is formed on a portion to be exposed that is supported by the rod-shaped members of the transporting apparatus from among the film-shaped member; and an exposure section that performs alignment of the portion to be exposed of the film-shaped member and a pattern of an exposed object based on detection result of the mark detection system, and exposes the portion to be exposed that is supported by the rod-shaped members and is moving in the moving direction.

A manufacturing apparatus according to a sixth aspect of the invention is a manufacturing apparatus that adheres a first film-shaped member and a second film-shaped member that comprises: a first transporting apparatus according to the fourth aspect of the invention that transports the first film-shaped member; a second transporting apparatus according to the fourth aspect of the invention that transports the second film-shaped member such that faces to the first film-shaped member; a mark detection system that detects alignment marks that are formed on a first portion and a second portion that are respectively supported by the rod-shaped members from among the first and second film-shaped members; and an adhesion section that performs alignment of the first portion and the second portion of the first and second film-shaped members, and adheres the first portion and the second portion that are supported by the rod-shaped members and are moving in the moving direction.

A device manufacturing method according to a seventh aspect of the invention comprises: exposing a film-shaped photosensitive substrate using exposure method according to the second aspect of the invention or using exposure apparatus according to the fifth aspect of the invention; and processing the film-shaped photosensitive substrate after exposure.

Moreover, a device manufacturing method according to an eighth aspect of the present invention comprises: adhering a first and second film-shaped members using manufacturing method according to the third aspect of the present invention or using the manufacturing apparatus according to the sixth aspect of the present invention.

According to the aspects of the invention, because a bar-shaped member that supports a film-shaped member is moved in a moving direction, and a film-shaped member is moved in a moving direction, it is possible to transport, for example, a elongated film-shaped member which is flexible along a target path with a high level of accuracy.

DESCRIPTION OF EMBODIMENTS

First Embodiment

A first embodiment of the invention will be described with reference to FIGS. 1 through 7.

Figure 1:
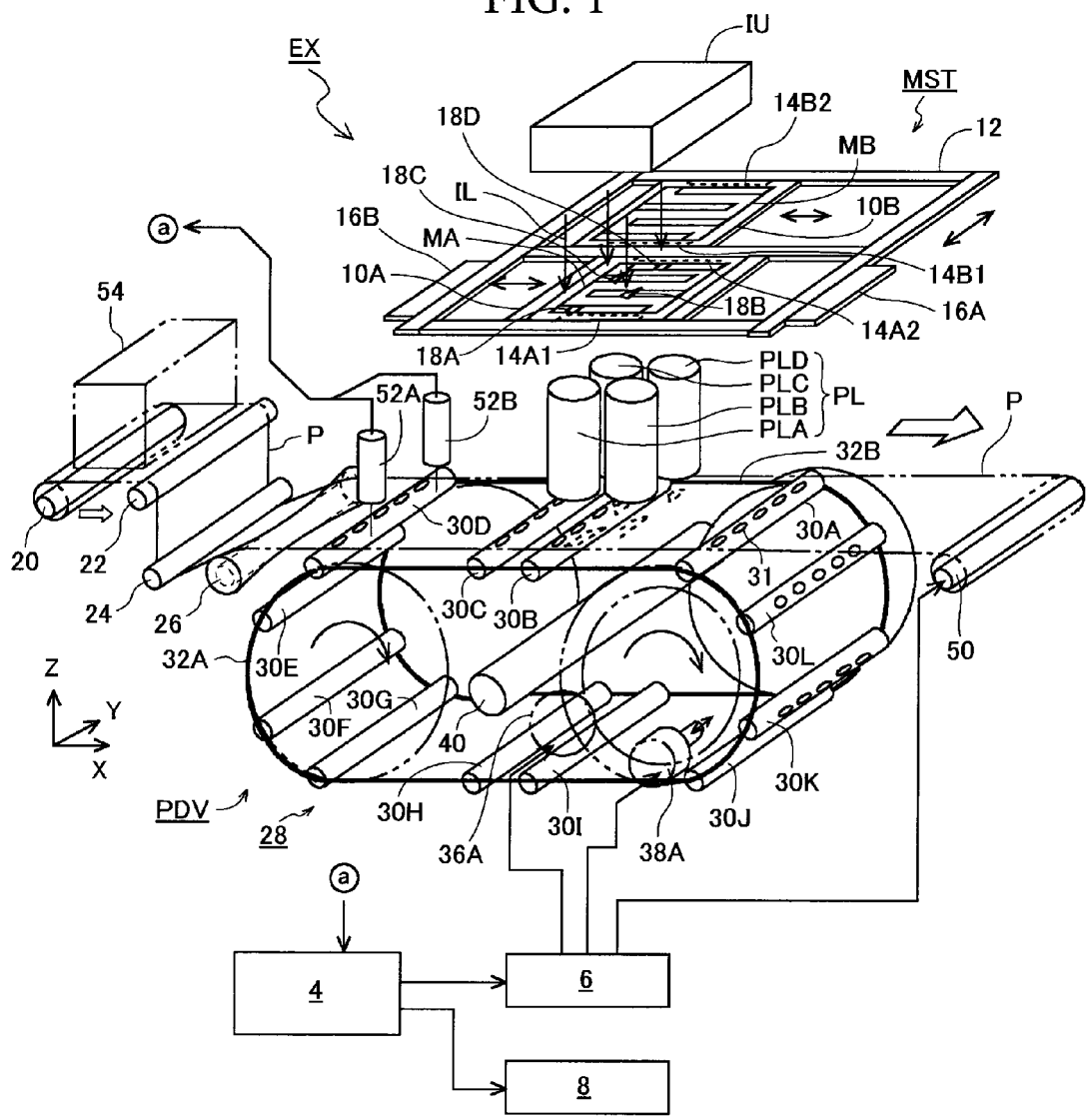
FIG. 1 is a perspective view showing the structure of an exposure apparatus according to a first embodiment.

FIG. 1 shows the schematic structure of an exposure apparatus (i.e., a projection exposure apparatus) EX of the present embodiment. In FIG. 1, the exposure apparatus EX includes an exposure light source (not shown), an illumination unit IU that illuminates a portion of a pattern of a first mask MA or a second mask MB by illumination light IL (i.e., exposure light) from the exposure light source, a mask stage MST that scans the masks MA and MB, for example, alternatingly in a predetermined direction, and a projection optical system PL that projects an image of the portion of the pattern of the mask MA or mask MB onto a film-shaped substrate P. Note that, in order to simplify the description, in FIG. 1, the film-shaped substrate P and the like are represented by a two-dot chain line. The mask stage MST is movably mounted on a mask base (not shown) in which an aperture (opening) for the illumination light IL passing through is formed between the illumination unit IU and the projection optical system PL.

Furthermore, the exposure apparatus EX includes a substrate moving apparatus PDV which moves the film-shaped substrate P, for example, continuously in a constant direction, and a main control unit 4 which is composed of a computer and performs integrated control of the operations of the exposure apparatus EX.

The film-shaped substrate P of the present embodiment is an elongated sheet-shaped member (i.e., a belt-shaped member) made of synthetic resin which is flexible and can be stored by being wound up into a roll shape, and is used, for example, to manufacture a display element and the like. Photoresist (i.e., a photosensitive material) is coated on a surface of this film-shaped substrate P during exposure. The description of the film-shaped substrate P as being in sheet form means that, compared to the width of the film-shaped substrate P, the thickness thereof is sufficiently small (i.e., thin) so that the film-shaped substrate P is flexible.

In the following description, positional relationships between members will be described with reference to an XYZ orthogonal coordinate system set in FIG. 1. In this XYZ orthogonal coordinate system, the X axis and the Y axis are set on a horizontal plane, while the Z axis is set to a vertical direction. In the present embodiment, pattern surfaces of the masks MA and MB are parallel to the XY plane, and the portion of the exposure surface of the film-shaped substrate P onto which the illumination light IL is irradiated during exposure is also parallel to the XY plane. The exposure apparatus EX is a scan exposure apparatus, and the moving direction (i.e., the scan direction) of the masks MA and MB during a scan exposure is parallel to the X axis (i.e., an X direction), and the moving direction (i.e., the scan direction) of the film-shaped substrate P in the exposure area of the projection optical system PL is also an X direction.

Firstly, an exposure light source (not shown) includes an ultrahigh pressure mercury lamp, an elliptical mirror, and a wavelength selection element. The illumination unit IU includes a light transmission optical system which includes a light guide or the like, and a splitting optical system which splits incident illumination light IL into a plurality of luminous fluxes, and then emits each of the luminous fluxes via an optical integrator, a relay optical system, variable blinds (i.e., variable field diaphragms), and a condenser lens. The illumination light IL is light selected from a wavelength region that includes, for example, g-rays (having a wavelength of 436 nm), h-rays (having a wavelength of 405 nm), and i-rays (having a wavelength of 365 nm). The illumination light IL illuminates four illumination areas 18A to 18D of the pattern surface of the mask MA (or mask MB) with a uniform illuminance distribution via the illumination unit IU, in which the illumination areas 18A to 18D are independently opened and closed by the aforementioned variable blinds, respectively. The illumination areas 18A to 18D have a shape that is narrow and elongated in a non-scan direction (i.e., the Y direction) that is orthogonal (intersects) to the scan direction.

The projection optical system PL is composed of four partial projection optical systems PLA to PLD that respectively form images of the patterns within the four illumination areas 18A to 18D on the exposure areas 18AP to 18DP (see FIG. 5B) of the film-shaped substrate P. A projection magnification β of the partial projection optical systems PLA to PLD (consequently the projection optical system PL) from the masks MA and MB to the film-shaped substrate P is an enlargement magnification (wherein β>1). The projection magnification β is, for example, approximately 2 times to 5 times. The partial projection optical systems PLA to PLD of the present embodiment are supported on a frame structure (not shown). In addition, the partial projection optical systems PLA to PLD form an intermediate image, and form erect images of the patterns within the illumination areas 18A to 18D on the film substrate P. The partial projection optical systems PLA to PLD can form inverted images in the X direction and/or the Y direction. In addition, it is possible, for example, to use refracting systems (dioptric systems) or catadioptric systems for the partial projection optical systems PLA to PLD.

Furthermore, among the four partial projection optical systems PLA to PLD, two partial projection optical systems PLA and PLC are arranged in a line in the Y direction, and the other two partial projection optical systems PLB and PLD are arranged at positions diagonally offset in the +X direction and the +Y direction from the partial projection optical systems PLA and PLC.

Figure 6A:
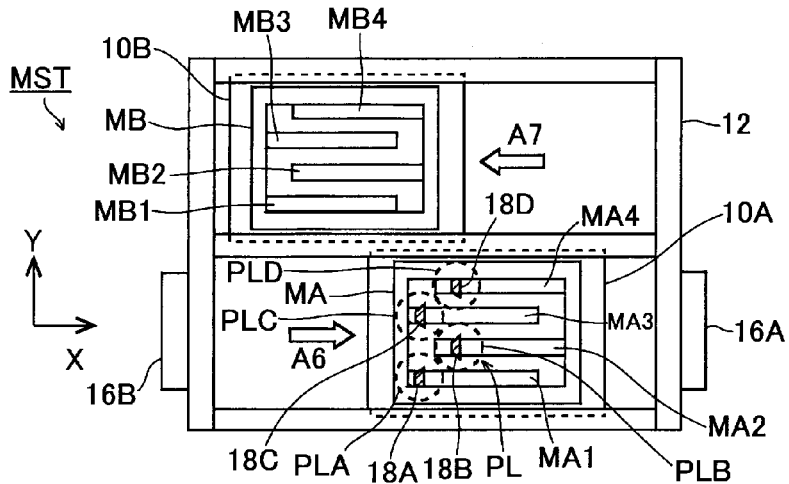
FIG. 6A is a plan view showing a mask stage during the exposure of the pattern of a first mask.

FIG. 6A is a plan view showing the mask stage MST in FIG. 1. In FIG. 6A, four rows of partial pattern areas MA1 to MA4 are formed at predetermined intervals in the Y direction in the pattern area of the first mask MA, and four rows of partial pattern areas MB1 to MB4 are formed at predetermined intervals in the Y direction in the pattern area of the second mask MB. The pattern to be transferred onto one pattern transfer area on the film-shaped substrate P is reduced to 1/β (wherein β is the projection magnification) and partial patterns thereof which are divided into four portions in the Y direction are formed respectively in the partial pattern areas MA1 to MA4 of the first masks MA and the partial pattern areas MB1 to MB4 of the second masks MB. For example, two two-dimensional alignment marks (not shown) are formed respectively in the vicinity of end portions in the X direction of the partial pattern areas MA1 to MA4 and MB1 to MB4 of the masks MA and MB. Alignment of the masks MA and MB is performed by detecting these alignment marks using a mask alignment system (not shown).

Moreover, during the exposure of the masks MA (or MB), images of the patterns of the partial pattern areas MA1 and MA3 (or MB1 and MB3) of the mask MA (or MB) are formed by the partial projection optical systems PLA and PLC on the film-shaped substrate P, and images of the patterns of the partial pattern areas MA2 and MA4 (or MB2 and MB4) of the mask MA (or MB) are formed by the partial projection optical systems PLB and PLD on the film-shaped substrate P. In this case, the positions of the two partial pattern areas MA1 and MA3 (or MB1 and MB3) and the two partial pattern areas MA2 and MA4 (or MB2 and MB4) are mutually offset in the X direction such that the images of the partial pattern areas MA1 to MA4 (or MB1 to MB4) of the mask MA (or MB) are formed at the same positions in the X direction on the film-shaped substrate P.

Furthermore, in order to reduce stitching error (joining error), it is preferable that double exposure to be performed in boundary portions of the partial pattern areas MA1 to MA4 and MB1 to MB4. Because of this, the illumination areas 18A to 18D are formed in a trapezoidal shape two ends (or one end) of which are sloped.

In FIG. 1, the mask stage MST includes a first stage 10A that holds and moves the first mask MA; a second stage 10B that holds and moves the second mask MB; a rectangular frame 12 in which the stages 10A and 10B can move in parallel; a pair of linear motors 14A1 and 14A2 (in FIG. 1, only the rotors thereof are shown) that drive the stage 10A in the X direction relative to the frame 12; a pair of linear motors 14B1 and 14B2 (in FIG. 1, only the rotors thereof are shown) that drive the stage 10B in the X direction relative to the frame 12; and a pair of linear motors 16A and 16B (in FIG. 1, only the stators thereof are shown) that drive the frame 12 in the Y direction relative to the mask base (not shown). In this case, by controlling the drive amount of the linear motors 14A1 and 14A2 (or 14B1 and 14B2), it is also possible to rotate the mask MA (or MB) within a predetermined range around an axis that is parallel to the Z axis (hereinafter, referred to as a θz direction).

Furthermore, position information which includes at least the positions in the X direction and the Y direction and the rotation angle in the θz direction of the stages 10A and 10B (i.e., the masks MA and MB), as well as position information of the frame 12 in the Y direction are measured respectively by two groups of two-axis laser interferometers (not shown) for the X axis and by a three-axis laser interferometer (not shown) for the Y axis. The measured values are supplied to the main control unit 4 and the mask stage control unit 8. The mask stage control unit 8 drives the linear motors 16A, 16B, 14A1, 14A2, 14B1, and 14B2 based on control information from the main control unit 4 and on these measured values so as to control the position in the Y direction of the frame 12, as well as the positions and speeds in the X direction and Y direction of the stages 10A and 10B (i.e., the masks MA and MB), and also the rotation angle in the θz direction thereof.

Moreover, the substrate moving apparatus PDV includes a supply roller 20 that unwinds the film-shaped substrate P which is in sheet form in the +X direction; a roller 22 that changes the direction of the film-shaped substrate P to the −Z direction; an air guide 24 that blows compressed air onto the film-shaped substrate P so as to contactlessly change the direction of the film-shaped substrate P to a diagonally (obliquely) upward direction; a drum-shaped roll guide 26 which is made, for example, from metal and is formed in an axially symmetric shape such that two end portions in the longitudinal direction (i.e., the Y direction) thereof are fatter than the center portion, and which changes the direction of the film-shaped substrate P passing over it to substantially +X direction; a ladder type stage apparatus 28 which uses suction to hold (suction holding) the film-shaped substrate P and moves it continuously in the +X direction; and a wind-up roller 50 onto which the film-shaped substrate P is wound. In this case, the supply roller 20, the roller 22, and the drum-shaped roll guide 26 are rotatably supported on a predetermined substrate-side frame (not shown). The air guide 24 is supported such that the position thereof in the Z direction relative to the substrate-side frame can be adjusted in order that the tension of the film-shaped substrate P is kept substantially constant, for example. Moreover, the wind-up roller 50 is driven to rotate by a drive motor (not shown) and this drive motor is controlled by a substrate stage control unit 6.

The ladder type stage apparatus 28 includes a first chain 32A that forms an elliptical (oval) loop which is parallel to the XZ plane; a second chain 32B that forms a loop shaped as if the first chain 32A were moved in parallel by a predetermined interval (distance) in the Y direction; a plurality of (here, 12 are used as an example) column-shaped rods 30A to 30L that is made, for example, from metal and that are substantially parallel to the Y direction respectively, and that link the first chain 32A and the second chain 32B in the Y direction; drive motors 36A and 36B (see FIG. 2C) that drive the chains 32A and 32B in synchronization in the same direction (i.e., a direction in which the top portions thereof move in the +X direction) and at essentially the same speeds; and a drive section 38A that drives end portions in the +X direction of the chains 32A and 32B collectively as a whole in the Y direction. The substrate stage control unit 6 controls operations of the drive motors 36A and 36B and the drive section 38A based on the control information from the main control unit 4.

Among the rods 30A to 30L, the intervals (space) between the sequentially adjacent two rods 30A and 30B, rods 30C and 30D, rods 30E and 30F, rods 30G and 30H, rods 30I and 30J, and rods 30K and 30L are the same as the length in the X direction of one pattern transfer area on the film-shaped substrate P. The intervals between these two rods is the same as the length (here, for example, between approximately a half and a somewhat smaller portion of the length in the X direction of a pattern transfer area) of the areas (i.e., empty areas) between two adjacent pattern transfer areas on the film-shaped substrate P. Furthermore, in the film-shaped substrate P, a portion having a length in the X direction that corresponds to two adjacent pattern transfer areas and the empty space between them is always supported substantially by any four of the rods 30A to 30L and is transported in the +X direction.

Moreover, a plurality of suction holes 31 that are used for vacuum suction are formed in a row extending in the Y direction in a contact portion of each of the rods 30A to 30L that comes into contact with the film-shaped substrate P. The suction holes 31 of the rods 30A to 30L are connected to a vacuum pump (not shown) via tubes (not shown) which have flexibility and elasticity, and a utility pipe 40 which is disposed so as to traverse the center of the chains 32A and 32B. Note that, instead of the plurality of suction holes 31, it is also possible to form a narrow, elongated suction groove in the Y direction.

Figure 2A:
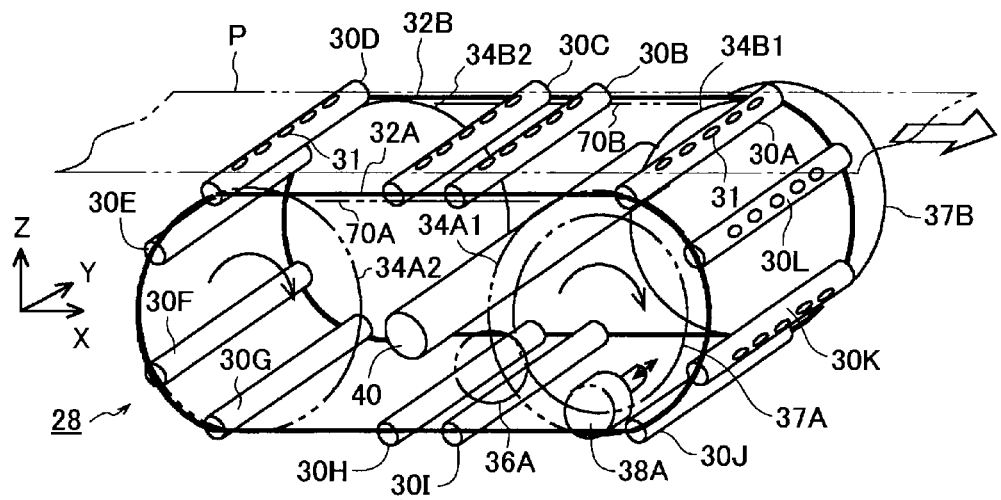
FIG. 2A is a perspective view showing a ladder type stage apparatus in FIG. 1.
Figure 2B:
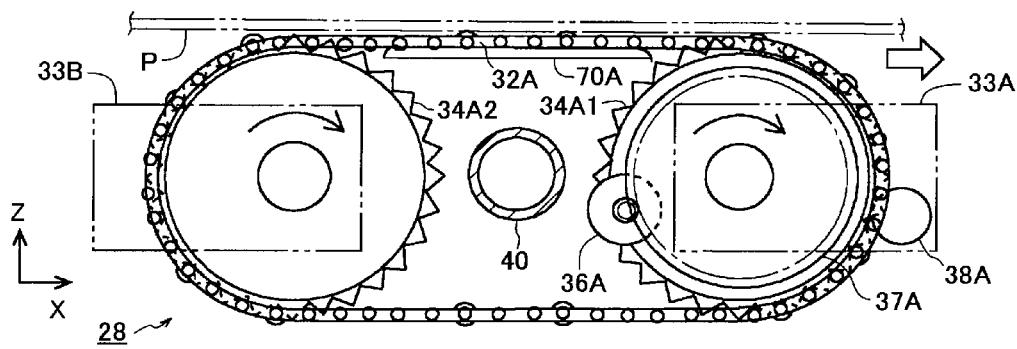
FIG. 2B is a front view showing the ladder type stage apparatus.
Figure 2C:
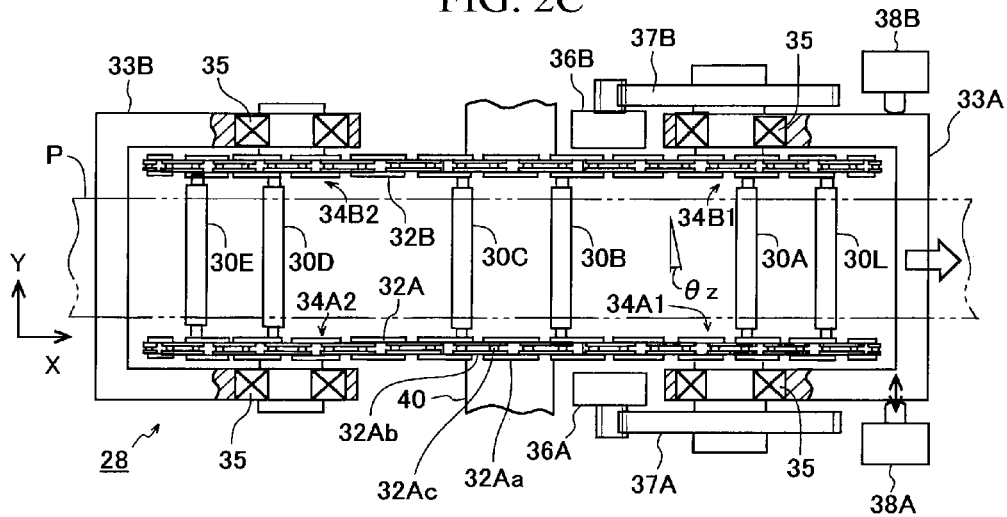
FIG. 2C is a partially cut away plan view showing the ladder type stage apparatus.

FIG. 2A is a perspective view showing the schematic structure of the ladder type stage apparatus 28 shown in FIG. 1. FIG. 2B is a front view showing the ladder type stage apparatus 28, and FIG. 2C is a plan view showing the ladder type stage apparatus 28. As is shown in FIG. 2C, in the chain 32A, a large number of inner plates 32Ab and a large number of outer plates 32Aa which correspond to these are alternatingly-linked by pins 32Ac. The structure of the chain 32B is the same as that of the chain 32A. The rods 30A to 30L are provided so as to join together, for example, a predetermined pin 32Ac of the chain 32A and a pin of the chain 32B which faces the pin 32Ac in the +Y direction therefrom, and are also provided so as to not rotate. Diameters of the two end portions of the rods 30A to 30L are formed smaller than the diameters of the portions where the film-shaped substrate P passing through. Note that, instead of the rods 30A to 30L, it is also possible to use a non-axially symmetric member (member) which has a semicircular cross-section or the like, and a circular arc-shaped surface thereof comes into contact with the film-shaped substrate P.

Moreover, sprockets 34A1 and 34B1 which have mutually identical shapes and which are able to rotate around an axis parallel to the Y axis engage with end portions in the +X direction of the chains 32A and 32B. In addition, sprockets 34A2 and 34B2 which have mutually identical shapes and which are able to rotate around an axis parallel to the Y axis engage with end portions in the −X direction of the chains 32A and 32B. Rotation axes of the sprockets 34A1 and 34B1 in the +X direction are supported by a U-shaped first base member 33A respectively via bearings 35. In addition, rotation axes of the sprockets 34A2 and 34B2 in the −X direction are supported by a U-shaped second base member 33B respectively via bearings 35. The first base member 33A is supported on a substrate-side frame (not shown) by the drive section 38A and a biasing section (urging section) 38B such that it is able to move within a predetermined range in the Y direction. The second base member 33B and the utility pipe 40 are supported on the substrate-side frame.

Gears 37A and 37B for driving which have the same shape are fixed to a rotation axes of the sprockets 34A1 and 34B1 on the +X direction side. Gears of drive motors 36A and 36B which have the same shape engage with the gears 37A and 37B. Rotary encoders 37AR and 37BR (see FIG. 3B) are mounted in the gears 37A and 37B. Based on rotation angle information of the sprockets 34A1 and 34B1 which is detected by the rotary encoders 37AR and 37BR, the substrate stage control unit 6 controls the rotation angle and rotation speed of the drive motors 36A and 36B. Furthermore, a linear encoder 38AL (see FIG. 3B) is mounted in the first base member 33A. Based on position information of the first base member 33A in the Y direction which is detected by the linear encoder 38AL, the substrate stage control unit 6 controls the drive amount of the drive section 38A.

According to this configuration, as a result of the drive motors 36A and 36B being driven in synchronization at the same rotation speed, the sprockets 34A1 and 34B1 are rotated at the same rotation speed, and the rods (i.e., some of the rods 30A to 30L) that are suction holding the film-shaped substrate P as well as the chains 32A and 32B are moved at the same speed in the +direction. Furthermore, by slightly changing the drive amount of the drive motors 36A and 36B, the relative positions in the X direction of the chains 32A and 32B are changed, and it becomes possible to control the rotation angle in the θz direction of the film-shaped substrate P on the chains. Furthermore, as a result of the sprockets 34A1 and 34B1 being displaced in the Y direction by the drive section 38A via the first base member 33A, it is possible to control the position in the Y direction of the film-shaped substrate P between the sprockets 34A1 and 34B1.

Relationships between the rotation angles of the sprockets 34A1 and 34B1 which are detected by the rotary encoders 37AR and 37BR and the positions of the each rods 30A to 30L which are held by the chains 32A and 32B are stored in a storage section of the substrate stage control unit 6.

Moreover, as is shown in FIG. 2A, a guide member 70A that supports the chain 32A between the two sprockets 34A1 and 34A2 in the −Y direction and a guide member 70B that supports the chain 32B between the two sprockets 34B1 and 34B2 in the +Y direction are supported on the substrate-side frame (not shown). As a result, the portions of the chains 32A and 32B (i.e., the rods 30A to 30L) that extend from the sprockets 34A2 and 34B2 to the sprockets 34A1 and 34B1 are prevented from sagging down in the −Z direction, and the film-shaped substrate P which is supported by the rods 30A to 30L moves in the +X direction along an XY plane.

Figure 3A:
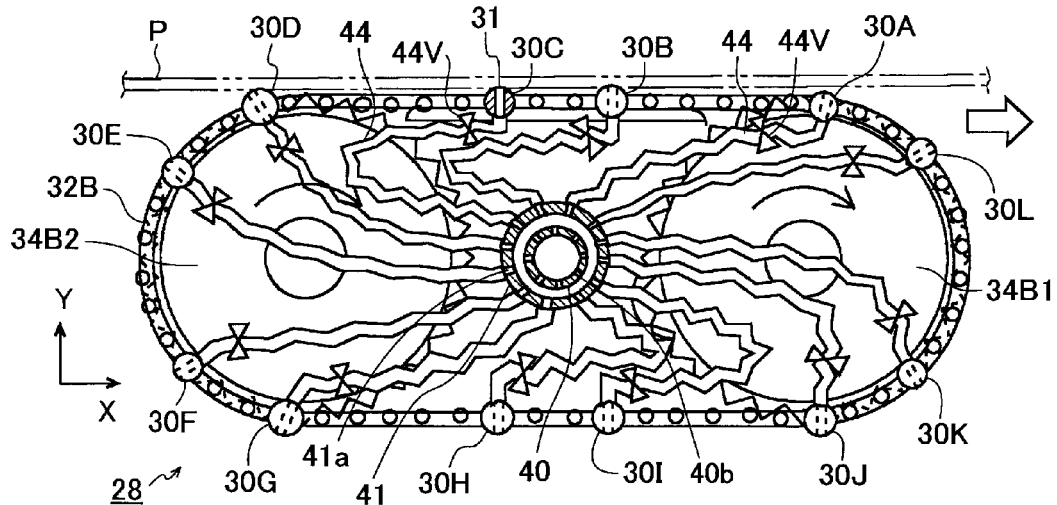
FIG. 3A is a cross-sectional view showing a suctioning mechanism of the ladder type stage apparatus in FIG. 2A.
Figure 3B:
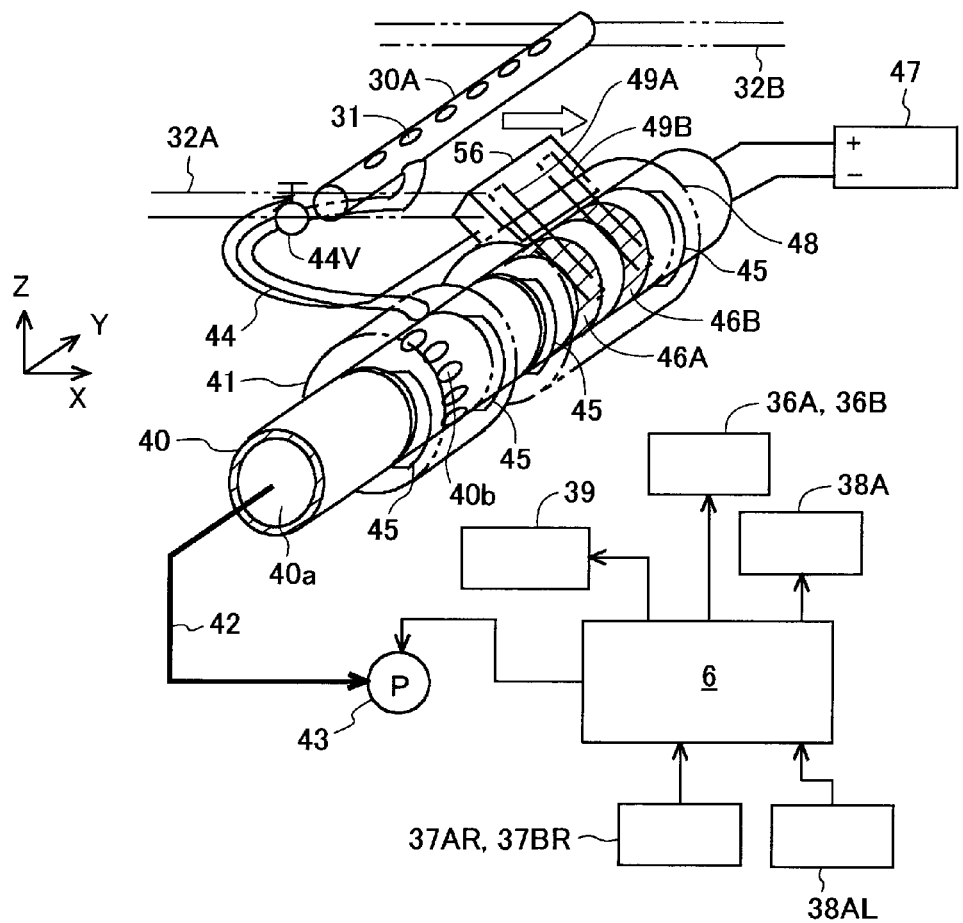
FIG. 3B is a perspective view showing a state in which a rod and a utility pipe in FIG. 3A are joined together.

FIG. 3A is a cross-sectional view showing a state in which the suction holes 31 provided in the rods 30A to 30L shown in FIG. 2A are joined to the utility pipe 40. FIG. 3B is a perspective view showing a state in which the one rod 30A shown in FIG. 3A is joined to the utility pipe 40. As is shown in FIG. 3B, the utility pipe 40 has a circular column shape, and an air hole 40a is formed inside an end portion in the −Y direction of the utility pipe 40. The air hole 40a is joined to a vacuum pump 43 via a pipe 42, and the portion around the air hole 40a inside the end portion of the utility pipe 40 is made airtight by a sealing mechanism (not shown). In addition, a large number of small air holes 40b that are communicated with the air hole 40a are formed in the surface of the end portion in the −Y direction of the utility pipe 40.

Furthermore, a first rotating member 41 that is rotatable around the outer surface (external) of the utility pipe 40 is positioned so as to cover the large number of through holes 40b of the utility pipe 40. A portion between the two end portions in the Y direction of the first rotating member 41 and the outer surface of the utility pipe 40 is sealed, for example, by a magnetic fluid bearing. The position in the Y direction of the first rotating member 41 on the outer surface of the utility pipe 40 is fixed by two E-rings 45. The plurality of suction holes 31 in the surface of the rod 30A are joined to an exhaust hole inside the rod 30A, and a switching valve 44V is provided partway along the exhaust hole. The exhaust hole is joined to an air hole 41a in the outer surface of the first rotating member 41 via a tube 44 which has flexibility and elasticity. The air hole 41a is communicated with the vacuum pump 43 via the air holes 40b and 40a in the utility pipe 40 and the pipe 42. The switching valve 44V switches between a first state in which the suction holes 31 of the rod 30A are connected to the air holes 40b of the utility pipe 40, and a second state in which the suction holes 31 of the rod 30A are open to the atmosphere.

In the same way, the plurality of suction holes 31 of the other rods 30B to 30L in FIG. 3A are also communicated with the vacuum pump 43 via the tubes 44 which have flexibility and elasticity and to which a switching valve 44V are provided respectively, the air hole 41a of the first rotating member 41, the air holes 40b and 40a of the utility pipe 40, and the pipe 42.

In FIG. 3B, a positive electrode portion 46A and a negative electrode portion 46B are formed on the outer surface of the end portion in the +Y direction of the utility pipe 40. The electrode portions 46A and 46B are connected to a positive electrode and a negative electrode of an external power supply 47 via an internal lead wire in the utility pipe 40. A second rotating member 48 that is rotatable around the outer surface of the utility pipe 40 is disposed so as to cover the electrode portions 46A and 46B. The position in the Y direction of the second rotating member 48 on the outer surface of the utility pipe 40 is also fixed by two E-rings 45. The first rotating member 41 and the second rotating member 48 are linked (connected) together by a linking (connecting) member (not shown), and rotate in conjunction with each other around the utility pipe 40.

Furthermore, planar electrode plates 49A and 49B are fixed to semicircular cylinder-shaped notch portions cut into the center portion of the second rotating member 48 so as to slide constantly over the electrode portions 46A and 46B, and a receiving section 56 is fixed to the outer surface of the second rotating member 48. Power is constantly (continuous power) supplied to the receiving section 56 via the electrode plates 49A and 49B. The substrate stage control unit 6 issues commands to a transmitting section 39 about the respective timings for switching between starting (i.e., a first state) and releasing (i.e. a second state) of the suction by the suction holes 31 of the rods 30A to 30L. In accordance with these, the transmitting section 39 transmits signals which indicate the timings of the switching to the receiving section 56 wirelessly via radio waves or infrared rays or the like. In accordance with these signals, the receiving section 56 sets the corresponding switching valve 44V to the first state (i.e., the state in which vacuum suction is performed by the suction holes 31) immediately prior to the rods 30A to 30L respectively supporting the film-shaped substrate P, and sets the corresponding switching valve 44V to the second state (i.e., the state in which the interior of the suction holes 31 is opened to atmospheric pressure) immediately prior to the rods 30A to 30L respectively moving away (separating) from the film-shaped substrate P.

By providing the first rotating member 41 and the second rotating member 48 such that they are rotatable around the outer surface of the utility pipe 40 in the above described manner, negative pressure from the vacuum pump 43 is supplied to the rods 30A to 30L that always rotate in a constant direction (here, a clockwise direction) around the utility pipe 40, and power is also supplied to the receiving section 56.

In FIG. 1, a resist coater 54 that coats photoresist onto the film-shaped substrate P is disposed above the film-shaped substrate P between the supply roller 20 and the roller 22. In addition, alignment systems 52A and 52B are located above an end portion in the −X direction of the film-shaped substrate P which is being supported on the ladder type stage apparatus 28 between the projection optical system PL and the drum-shaped roll guide 26. The alignment systems 52A and 52B employ, for example, image processing, and detect the positions of alignment marks on the film-shaped substrate P at predetermined intervals in the Y direction. Detection results from the alignment systems 52A and 52B are supplied to an alignment control section within the main control unit 4. Positional relationships (i.e., a baseline) between the centers of detection of the alignment systems 52A and 52B and the centers of images of the patterns on the masks MA and MB formed from the projection optical system PL can be measured, for example, by mounting reference members (not shown) such that they extend from the detection areas of the alignment systems 52A and 52B to the projection area of the projection optical system PL, in which the reference members are elongated in the X direction and have, for example, a plurality of reference marks whose positional relationships are known. Information about these positional relationships is stored in the alignment control section within the main control unit 4.

Figure 5A:
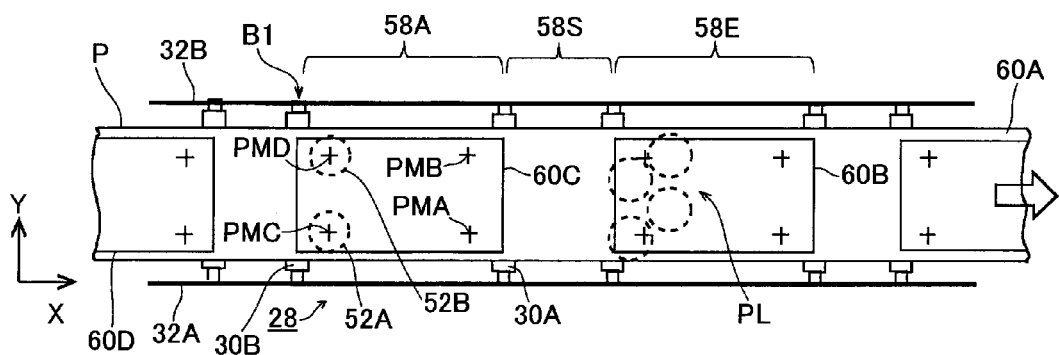
FIG. 5A is a plan view showing a film-shaped substrate during the alignment of the pattern transfer area.

FIG. 5A is a plan view showing a portion of the film-shaped substrate P which is supported by the ladder type stage apparatus 28 shown in FIG. 1. In FIG. 5A, a large number of pattern transfer areas 60A, 60B, 60C, . . . are formed at predetermined intervals in the X direction on the film-shaped substrate P. Alignment marks PMA to PMD are formed in two locations in each of the pattern transfer areas 60A etc at the same intervals as the intervals in the Y direction of the alignment systems 52A and 52B, respectively. In this case, an area extending in the +X direction from the detection area of the alignment systems 52A and 52B for substantially the same distance (length) as the length of the pattern transfer areas forms an alignment area 58A. An area extending in the +X direction from the exposure area of the projection optical system PL for substantially the same distance as the length of the pattern transfer areas forms an exposure area 58E. An area between the alignment area 58A and the exposure area 58E forms an intermediate area 58S. In the present embodiment, the portion of the film-shaped substrate P that passes substantially through the alignment area 58A, the intermediate area 58S and the exposure area 58E is supported by means of suction by some of the rods 30A to 30L of the ladder type stage apparatus 28, and moves continuously in the +X direction.

Hereinafter, an example of the operation performed when one roll of the film-shaped substrate P is exposed using the exposure apparatus EX of the present embodiment will be described with reference to the flow chart of FIG. 7. This exposure operation is controlled by the main control unit 4. At this time, it will be assumed that the masks MA and MB are loaded onto the stages 10A and 10B of the first mask stage MST in FIG. 1, and that the alignment thereof has been completed.

Figure 7:
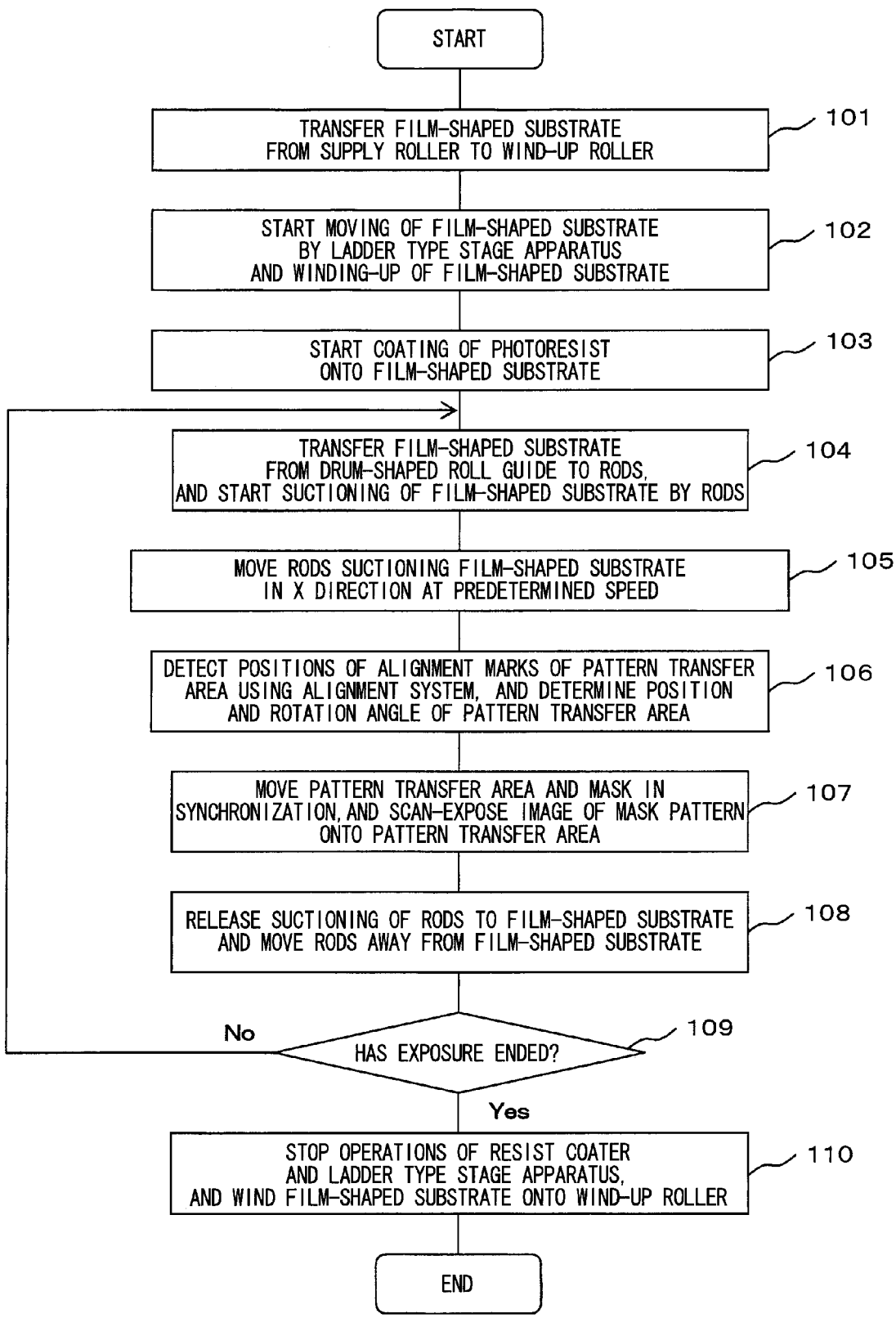
FIG. 7 is a flowchart showing an example of an exposure operation of the first embodiment.

Firstly, in step 101 in FIG. 7, one roll of the film-shaped substrate P which is in sheet form is attached to the supply roller 20 shown in FIG. 1. At this stage, photoresist has not been coated onto the film-shaped substrate P. Note that the alignment marks PMA to PMD have been respectively formed on (attached to) the series of pattern transfer areas 60A etc on the film-shaped substrate P in the manufacturing processes performed. The distal end portion of the film-shaped substrate P is transferred to the wind-up roller 50 via the roller 22, the air guide 24, the drum-shaped roll guide 26, and the top surface of the ladder type stage apparatus 28. In the next step 102, the winding-up of the film-shaped substrate P in the +X direction by the wind-up roller 50 is started, and the moving of the film-shaped substrate P in the +X direction by the ladder type stage apparatus 28 is started. Note that the movement speed of the film-shaped substrate P in the +X direction is regulated by the ladder type stage apparatus 28. The wind-up speed of the wind-up roller 50 is set such that sagging of the film-shaped substrate P between the ladder type stage apparatus 28 and the wind-up roller 50 is contained within a predetermined range. In the next step 103, coating of photoresist onto the film-shaped substrate P by the resist coater 54 is started.

The following operations relate to every fourth rod among the rods 30A to 30L, namely, the rods 30A, 30E, and 30I of the ladder stage apparatus 28, and the same type of operation is also performed in sequence for the other rods 30B to 30D, 30F to 30H, and 30J to 30L. Namely, in the next step 104, as is shown by the arrow A1 in FIG. 4A, the rod 30A in which the suctioning by the suction holes 31 has been released is lifted diagonally upward, and when it arrives at a position B1 at an end portion in the −X direction of the top surface of the ladder stage apparatus 28, the film-shaped substrate P is transferred from the drum-shaped roll guide 26 to the rod 30A. At substantially the same time as this, the switching valve 44V of the tube 44 which is communicated with the suction holes 31 of the rod 30A is set to the first state by the substrate stage control unit 6, the transmitting section 39, and the receiving section 56 in FIG. 3B, and the suctioning of the film-shaped substrate P by the suction holes 31 in the rod 30A is started.

Figure 4A:
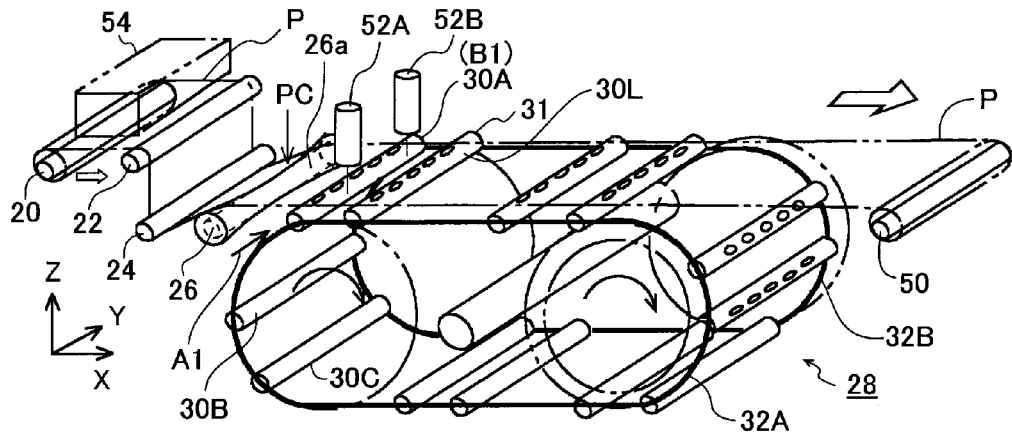
FIG. 4A is a perspective view showing a state in which a film-shaped substrate is transferred from a drum-shaped roll guide to the rod.

At this time, as is shown in FIG. 4A, because the center portion of the drum-shaped roll guide 26 is narrow, the film-shaped substrate P is transferred to the rod 30A in a state that a central portion PC thereof positioned lower in the −Z direction. As a result, the suctioning of the film-shaped substrate P by the rod 30A starts from the center portion PC and moves gradually towards the two end portions thereof. Accordingly, there is no distortion or the like of the film-shaped substrate P, and the film-shaped substrate P is suctioned and held stably by the rod 30A with a high degree of flatness maintained therein. As a result, the subsequent alignment and exposure can be performed with a high level of accuracy.

Figure 4B:
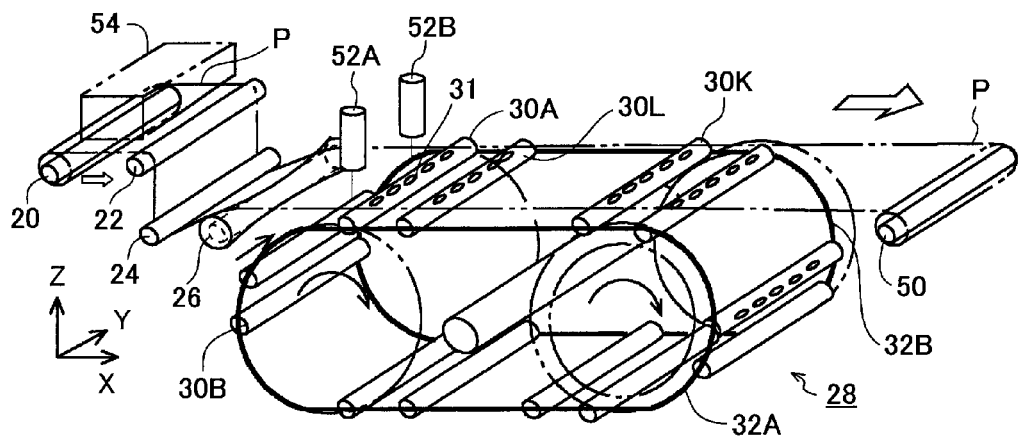
FIG. 4B is a perspective view showing a state in which alignment of a pattern transfer area has started.
Figure 4C:
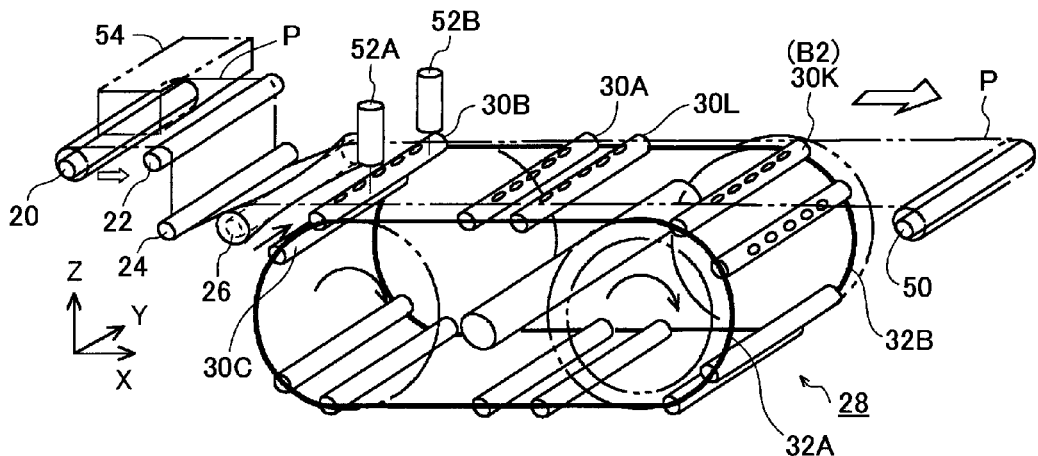
FIG. 4C is a perspective view showing a state in which alignment of a pattern transfer area is ending.

In the next step 105, the rod 30A which is suctioning the film-shaped substrate P is moved at a predetermined movement speed (i.e., scan speed) in the +X direction by the ladder stage apparatus 28. Next, in step 106, as is shown in FIG. 4B, when the rod 30A passes the detection area of the alignment systems 52A and 52B, the positions of the alignment marks PMA and PMB in the pattern transfer area 60C on the film-shaped substrate P shown in FIG. 5A are detected by the alignment systems 52A and 52B. When the rod 30A moves further in the +X direction, the next rod 30B arrives at the position B1 and the rod 30B also supports the film-shaped substrate P by suction. Thereafter, when the rods 30A and 30B arrive at the positions shown in FIG. 4C, the positions of the alignment marks PMC and PMD in the pattern transfer area 60C on the film-shaped substrate P are detected by the alignment systems 52A and 52B, and the two end portions of the pattern transfer area 60C are supported stably by the rod 30A and the rod 30B. The detection results of the positions of the alignment marks PMA to PMD are supplied to the alignment control section within the main control unit 4. The alignment control section determines the amounts of positional shift ($\Delta XC$, $\Delta YC$) in the X direction and the Y direction from the target position of the pattern transfer area 60C and the amount of rotation angle shift $\Delta \theta zc$ in the $\Delta z$ direction from these detection results, and supplies the amounts of positional shift and the amount of rotation angle shift to the stage control section within the main control unit 4.

Figure 5B:
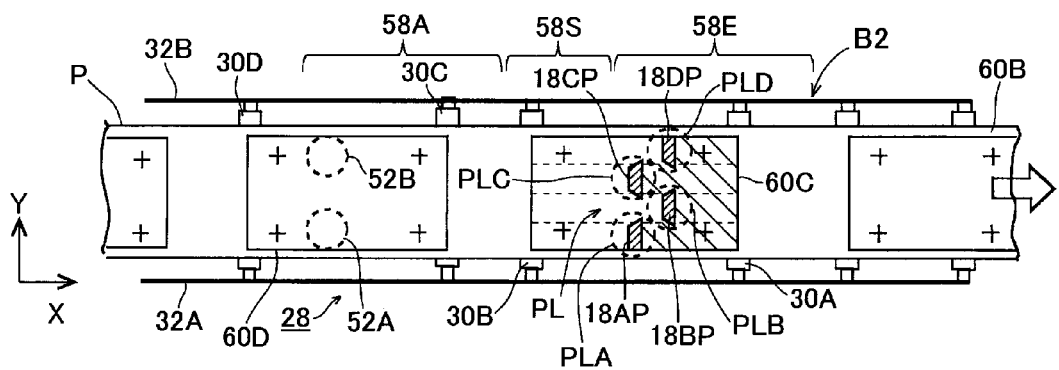
FIG. 5B is a plan view showing a film-shaped substrate during the exposure of the pattern transfer area.

Based on the amounts of positional shift ($\Delta XC$, $\Delta YC$) and the amount of rotation angle shift $\Delta \theta zc$, the stage control section drives the mask stage MST and the ladder type stage apparatus 28 via the mask stage control unit 8 and the substrate stage control unit 6 such that an image of the pattern of the mask MA is accurately overlaid and exposed onto the pattern transfer area 60C of the film-shaped substrate P. Namely, in the next step 107, as is shown in FIG. 6A, a movement operation of the partial pattern areas MA1 to MA4 is performed in synchronization with a movement operation of the four partial areas of the pattern transfer areas 60, so that an image of the pattern of the mask MA is scan-exposed onto the pattern transfer area 60C. In the movement operation of the partial pattern areas MA1 to MA4, the partial pattern areas MA1 to MA4 of the mask MA are moved at a speed VM in the +X direction shown by the arrow A6 with respect to the illumination areas 18A to 18D of the partial projection optical systems PLA to PLD of the projection optical system PL. In the movement operation of the four partial areas of the pattern transfer areas 60, as is shown in FIG. 5B, the four partial areas of the pattern transfer areas 60 of the film-shaped substrate P are moved at a speed VM·β (wherein β is the projection magnification of the projection optical system PL) in the +X direction with respect to the exposure areas 18AP to 18DP of the partial projection optical systems PLA to PLD. At this time, for example, the position and rotation angle of the mask MA are corrected as it is being moved such that the aforementioned amounts of positional shift (ΔXC, ΔYC) and the amount of rotation angle shift Δθzc are compensated for.

Note that it is also possible to correct these amounts of positional shift and the amount of rotation angle shift on the side of the pattern transfer area 60C of the film-shaped substrate P by the movement speed at which the rods 30A to 30L are moved by the ladder type stage apparatus 28, and by controlling the balance of the movement speeds of the chains 32A and 32B, and by the drive section 38A. Furthermore, in FIG. 6A, when the mask MA is being moved in the +X direction via the first stage 10A, the mask MB is moved in the −X direction on the second stage 10B side as is shown by the arrow A7.

During this scan exposure, when the position of the rod 30A arrives at the position B2 of the end portion in the +X direction of the exposure area 58E, in step 108, the switching valve 44V of the tube 44 which is communicated with the suction holes 31 of the rod 30A is set to the second state, and the suctioning of the film-shaped substrate P by the suction holes 31 of the rod 30A is released. The rod 30A is then moved diagonally downwards away from the film-shaped substrate P by the ladder type stage apparatus 28. When the next rod 30B then arrives at the position B2, the scan exposure onto the pattern transfer area 60C is ended.

Figure 6B:
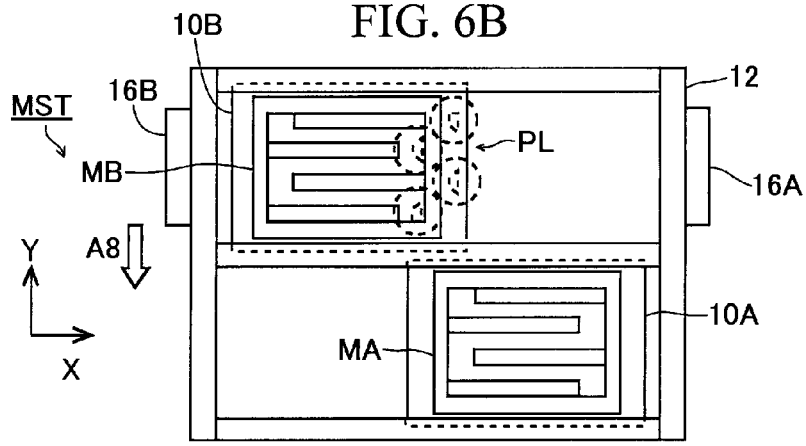
FIG. 6B is a plan view showing a mask stage during the step movement of masks.
Figure 6C:
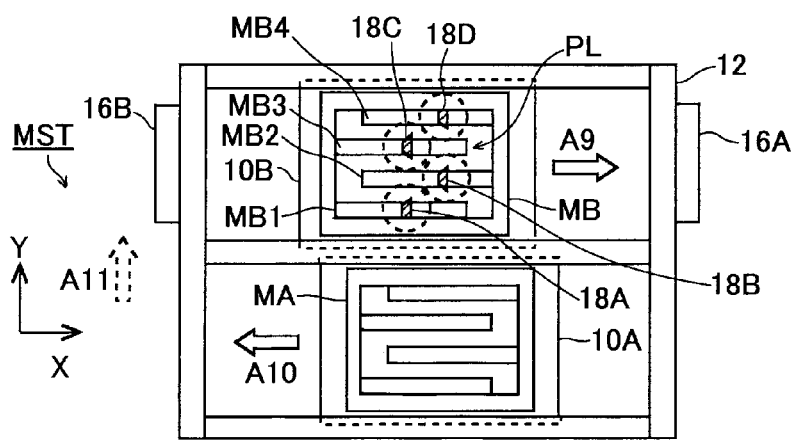
FIG. 6C is a plan view showing a mask stage during the exposure of the pattern of a second mask.

At this time, as is shown in FIG. 6B, on the mask stage MST side, the entire frame 12 moves in the −Y direction shown by the arrow A8, and the mask MB on the second stage 10B moves to the scan start position for the illumination area of the projection optical system PL. Next, as is shown in FIG. 6C, during the scan exposure onto the next pattern transfer area 60D of the film-shaped substrate P, by moving the partial pattern areas MB1 to MB4 in the +X direction shown by the arrow A9 to the illumination areas 18A to 18D of the projection optical system PL, an image of the pattern of the mask MB is exposed onto the pattern transfer area 60D. At this time, because the mask MA is moving in the −X direction shown by the arrow A10, by moving the frame 12 in the +Y direction shown by the arrow A11, it is subsequently possible to expose an image of the pattern on the mask MA onto the next pattern transfer area. In this manner, by alternatingly exposing images of the patterns of the masks MA and MB onto adjacent pattern transfer areas on the film-shaped substrate P, it is possible to perform exposure onto the film-shaped substrate P efficiently while moving the film-shaped substrate P continuously in the same direction (i.e., the +X direction) and also shortening the empty areas between adjacent pattern transfer areas.

Moreover, during the scan exposure of the pattern transfer area 60C, the alignment of the next pattern transfer area 60D on the film-shaped substrate P which is being supported by the rods 30C and 30D shown in FIG. 5B is performed.

In the next step 109, a determination is performed as to whether or not exposure of the film-shaped substrate P has ended. If the exposure has not ended, the operations of steps 104 through 108 are sequentially repeated for the rods 30E, 30I, and 30A and the like, and the alignment and scan exposure are repeated for the next pattern transfer area 60E and the like of the film-shaped substrate P.

If it is determined in step 109 that the exposure of the film-shaped substrate P has ended, the operation moves to step 110, and the operations of the resist coater 54 and the ladder type stage apparatus 28 are stopped by the main control unit 4, and the film-shaped substrate P is wound onto the wind-up roller 50. The wound-up film-shaped substrate P is transported, for example, to a developing apparatus (not shown) and is developed.

In this manner, according to the exposure apparatus EX of the present embodiment, it is possible to efficiently coat photoresist and expose an image of a mask pattern onto one role of a film-shaped substrate P.

The operation and effects and the like of the present embodiment are as follows.

(1) In the present embodiment, the substrate moving apparatus PDV which transports the film-shaped substrate P includes a ladder type stage apparatus 28 that is used for support the film-shaped substrate P. In addition, the ladder type stage apparatus 28 includes a plurality of rods 30A to 30L, and a drive mechanism that moves a plurality of rods that are supporting the film-shaped substrate P from among the rods 30A to 30L in synchronization in the +X direction. The plurality of rods 30A to 30L are arranged such that their longitudinal direction extends in a Y direction which is orthogonal (intersects) to a +X direction which is a moving direction along a surface of a film-shaped substrate P, and such that they line up in parallel in this moving direction.

Moreover, the method for transporting the film-shaped substrate P by the substrate moving apparatus PDV includes step 102 in which the film-shaped substrate P is moved in the +X direction; step 104 in which a plurality of surface locations of the film-shaped substrate P are supported by a plurality of rods from among the plurality of rods 30A to 30L; and steps 105 and 106 in which this plurality of rods that are supporting the film-shaped substrate P are moved in synchronization in the +X direction.

According to the present embodiment, the film-shaped substrate P is moved by moving the plurality of rods that are supporting the film-shaped substrate P from among the rods 30A to 30L in the moving direction. Accordingly, because there is substantially no relative movement between film-shaped substrate P and the members supporting it, the elongated film-shaped substrate P which is flexible can be transported with a high level of accuracy along a target transporting path.

(2) Moreover, the substrate moving apparatus PDV includes a wind-up roller 50 that moves the film-shaped substrate P in the +X direction. In addition, the ladder type stage apparatus 28 includes a pair of chains 32A and 32B as well as drive motors 36A and 36B. The pair of chains 32A and 32B join together the rods 30A to 30L along a loop-shaped trajectory which includes a position B1 where the rods 30A to 30L support the film-shaped substrate P, and a position B2 which is downstream from the position B1 and is where the rods 30A to 30L are moved away (separated) from the film-shaped substrate P. The drive motors 36A and 36B move the rods 30A to 30L along the loop-shaped trajectory via the chains 32A and 32B, by rotating sprockets 34A1 and 34A2 which drive the chains 32A and 32B.

By using this ladder type stage apparatus 28, it is possible to move the film-shaped substrate P stably in the moving direction by means of a simple structure which moves the rods 30A to 30L in a constant direction along this closed loop.

Accordingly, even if the film-shaped substrate P is an elongated sheet-shaped photosensitive object (i.e., a belt-shaped member) which is flexible, it is possible to perform exposure onto a series of pattern formation areas on the film-shaped substrate P efficiently while moving the film-shaped substrate P continuously in a constant direction.

(3) Moreover, the substrate moving apparatus PDV includes a rotatable drum-shaped roll guide 26 whose longitudinal direction extends in the Y direction and whose two end portions are formed in a fatter rod shape than the center portion thereof, and that is used to bend the transporting path of the film-shaped substrate P and transfer the film-shaped substrate P to a rod of the rods 30A to 30L which is located at the position B1. Namely, the drum-shaped roll guide 26 is arranged such that its longitudinal direction is parallel to the rods 30A to 30L.

In addition, in step 104, the film-shaped substrate P is transferred via the drum-shaped roll guide 26 to a rod of the rods 30A to 30L which is located at the position B1. Accordingly, because the film-shaped substrate P is supported on the rod initially at the center portion thereof and then gradually outwards towards the two end portions thereof, there is no distortion in the film-shaped substrate P when it is being transferred.

(4) When the film-shaped substrate P is supported by, for example, at least the two rods 30A and 30B from among the plurality of rods 30A to 30L, it is possible to provide an interval adjustment mechanism that adjusts the interval in the X direction between the two rods 30A and 30B that are supporting the film-shaped substrate P.

For example, in FIG. 2C, this interval adjustment mechanism is provided in a portion of the chains 32A and 32B that support the rod 30A, and can be composed of a drive element (i.e., a piezoelectric element or the like) that moves the rod 30A in the ±X direction. There are cases when, by widening the interval between the rods 30A and 30B using this interval adjustment mechanism, it is possible to prevent the portion of the film-shaped substrate P which is being held by suction by the rods 30A and 30B from sagging downwards.

Moreover, the ladder type stage apparatus 28 is always supporting the film-shaped substrate P using, for example, four rods from among the rods 30A to 30L. However, it is also possible to support the film-shaped substrate P using a greater number of rods. Furthermore, it is also possible to support the film-shaped substrate P using only two rods from among the rods 30A to 30L.

Note that the number of the rods 30A to 30L of the ladder type stage apparatus 28 is optional. For example, it is also possible to provide only three rods that are moved in a loop-shaped trajectory, and to support the film-shaped substrate P and transport it in the +X direction using two of these rods.

(5) Moreover, the ladder type stage apparatus 28 includes a suctioning mechanism which includes the suction holes 31, the tube 44 which is equipped with the switching valve 44V, the utility pipe 40, and the vacuum pump 43 in order to vacuum-suction the film-shaped substrate P onto each of the rods 30A to 30L during the period when the rods 30A to 30L are supporting the film-shaped substrate P. Accordingly, the film-shaped substrate P can be supported stably by the rods 30A to 30L.

Note that it is also possible to suction the film-shaped substrate P to the rods 30A to 30L using, for example, electrostatic suction.

(6) The exposure apparatus EX of the present embodiment is an exposure apparatus that exposes the film-shaped substrate P, and includes a substrate moving apparatus PDV that is used to transport the film-shaped substrate P; alignment systems 52A and 52B that detect alignment marks PMA through PMD that are formed on the pattern transfer areas of the film-shaped substrate P that are being supported by the rods 30A to 30L; and an exposure section that includes a projection optical system PL that aligns the positions of the pattern transfer areas of the film-shaped substrate P with the positions of images of the pattern of the mask MA (or MB) based on detection results from the alignment systems 52A and 52B, and exposes the pattern transfer areas that are supported by the rods 30A to 30L and are moving in the +X direction.

Moreover, the exposure method performed by the exposure apparatus EX includes step 105 in which, using the transporting method performed by the substrate moving apparatus PDV, the film-shaped substrate P is moved in the +X direction; step 106 in which the alignment marks PMA to PMD that are formed on the pattern transfer areas of the film-shaped substrate P that are being supported by the rods 30A to 30L are detected; and step 107 in which, based on the detection results of the alignment mark, the positions of the pattern transfer areas and the images of the pattern of the mask MA (or MB) are aligned, and the pattern transfer areas that are supported by the rods 30A to 30L and are moving in the +X direction are exposed.

According to the exposure apparatus EX or to the exposure method thereof, because the film-shaped substrate P can be moved with high level of accuracy along the target path, it is possible to expose images of the patterns of the masks MA and MB onto each pattern transfer area on a film-shaped substrate P with a high level of accuracy as well as with a high level of overlay accuracy.

Note that the following variants are possible in the present embodiment.

(1) As is shown in FIG. 5A, in the above described embodiment, a narrow intermediate area 58S is provided between the alignment area 58A and the exposure area 58E.

Figure 8:
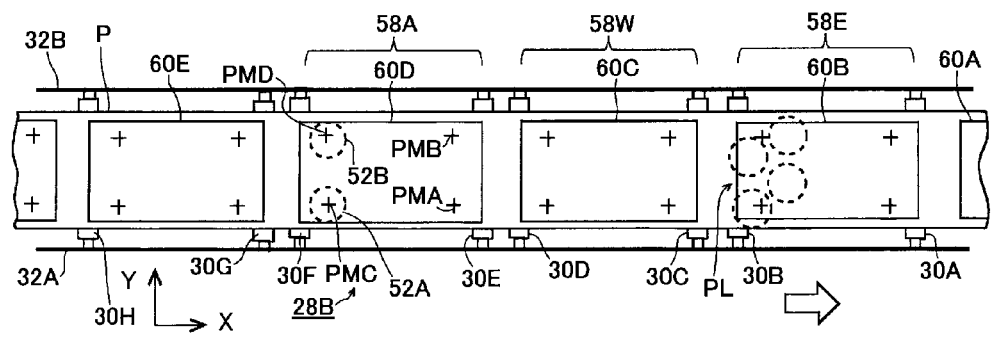
FIG. 8 is a plan view showing the ladder type stage apparatus according to a variant example of the first embodiment.

In contrast to this, as is shown by a ladder type stage apparatus 28B which includes the rod 30A and the like shown in FIG. 8, it is also possible to provide a standby area 58W having substantially the same length as the exposure area 58E between the alignment area 58A whose end portion corresponds to the detection areas of the alignment systems 52A and 52B and the exposure area 58A whose end portion corresponds to the exposure area of the projection optical system PL. In this case, the length of the portion of the ladder type stage apparatus 28B which is supporting the film-shaped substrate P is longer than the ladder type stage apparatus 28. However, it is possible to correct positional shift and the like while the pattern transfer areas 60B and 60C and the like of the film-shaped substrate P which are to be exposed are passing through the standby area 58W. Accordingly, it is possible to narrow the interval between the respective pattern transfer areas 60B and 60C and the like on the film-shaped substrate P.

(2) Next, the projection optical system PL is composed of four partial projection optical systems PLA to PLD. However, the number and placement of the partial projection optical systems PLA to PLD is optional. Furthermore, the projection optical system PL may also be composed of a single projection optical system. The projection magnification of the projection optical system PL may also be an equivalent magnification or a reduction magnification.

Furthermore, the projection optical system PL projects images of the patterns of the masks MA and MB onto the film-shaped substrate P. However, instead of the masks MA and MB, it is also possible for images of variable patterns formed on a liquid crystal panel or digital mirror device (DMD) or the like to be formed on the film-shaped substrate P by the projection optical system PL. In this case, the intervals between two adjacent pattern transfer areas on the film-shaped substrate P can be reduced to the minimum possible.

Furthermore, instead of the projection optical system PL, it is also possible to draw a pattern on the film-shaped substrate P using an electron beam drawing apparatus.

(3) Moreover, in the above described embodiment, the film-shaped substrate P is moved continuously in the +X direction. However, it is also possible for the film-shaped substrate P to be moved intermittently. In this case, for example, when the positions of the alignment marks on the film-shaped substrate P are being detected by the alignment systems 52A and 52B, the film-shaped substrate P is stopped, and at other times the film-shaped substrate P is moved continuously in the +X direction.

(4) Moreover, it is not absolutely necessary for the movement speed of the film-shaped substrate P to be a constant speed, and it is also possible, for example, for the movement speed of the film-shaped substrate P during exposure to be different from the movement speed at other times.

(5) The ladder type stage apparatus 28 joins together the rods 30A to 30L by means of the chains 32A and 32B. However, it is also possible, for example, for the rods 30A to 30L to be supported and moved in a constant direction by an endless track type of mechanism such as those used in construction machinery and the like.

Furthermore, in the above described embodiment, the two end portions in the X direction of the respective pattern transfer areas 60A and the like on the film-shaped substrate P are supported by the rods 30A to 30L. However, it is also possible to support a portion of the film-shaped substrate P that includes one or a plurality of pattern transfer areas and move this in the X direction by means of a large number of rods that are disposed at an equal interval in the X direction.

(6) In the substrate moving apparatus PDV shown in FIG. 1, instead of the drum-shaped roll guide 26, it is also possible to use a rotatable circular column-shaped roll. Moreover, in this case, it is also possible to provide a mechanism that deforms (i.e., bends) a center portion of the rod 30A and the like protrudes outwards towards the film-shaped substrate P, in which the rod 30A and the like are the rods that arrive at the position B1 (see FIG. 4A), which is the transfer position where the film-shaped substrate P is transferred to the ladder type stage apparatus 28. As a result of this, in the same way as when the drum-shaped roll guide 26 is used, the film-shaped substrate P is suctioned onto the rod 30A initially from the center portion thereof and then gradually outwards towards the two end portions, so that the film-shaped substrate P is transferred to the rod 30A without any distortion or the like.

(7) Moreover, it is also possible to dispose a developing apparatus between the ladder type stage apparatus 28 and the wind-up roller 50 shown in FIG. 1, and develop the photoresist on the film-shaped substrate P before it is wound onto the wind-up roller 50.

Second Embodiment

Figure 9:
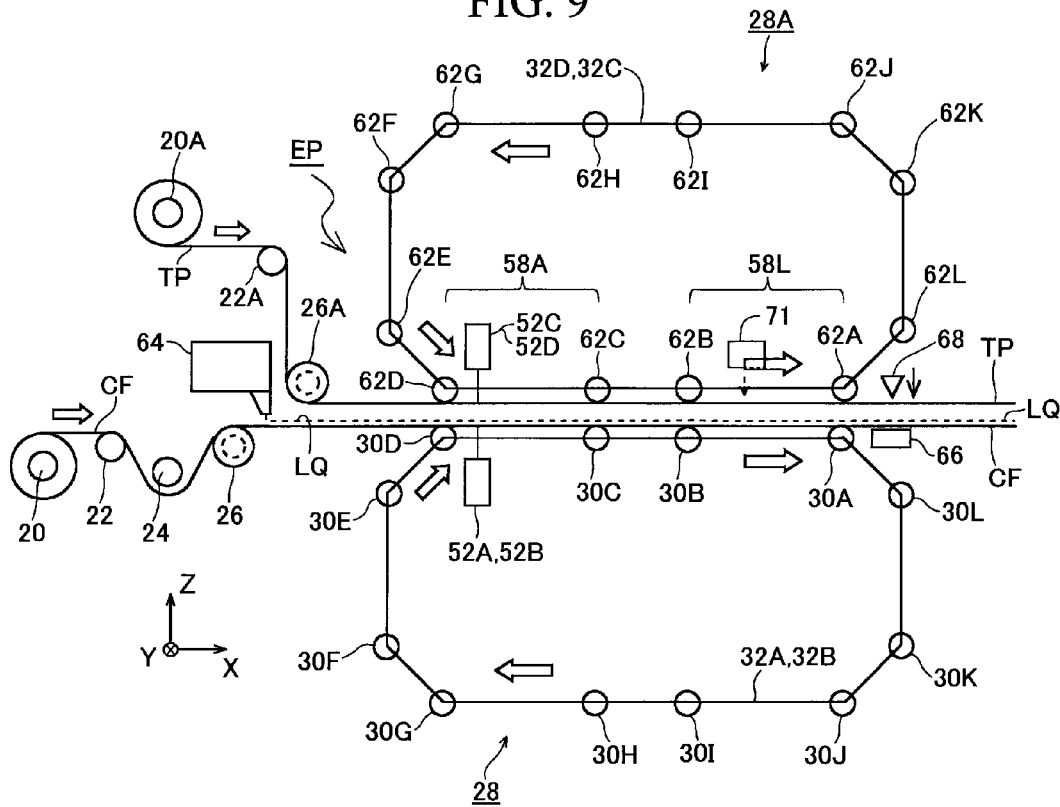
FIG. 9 is a front view showing the schematic structure of a roll member paneling apparatus according to a second embodiment.
Figure 10:
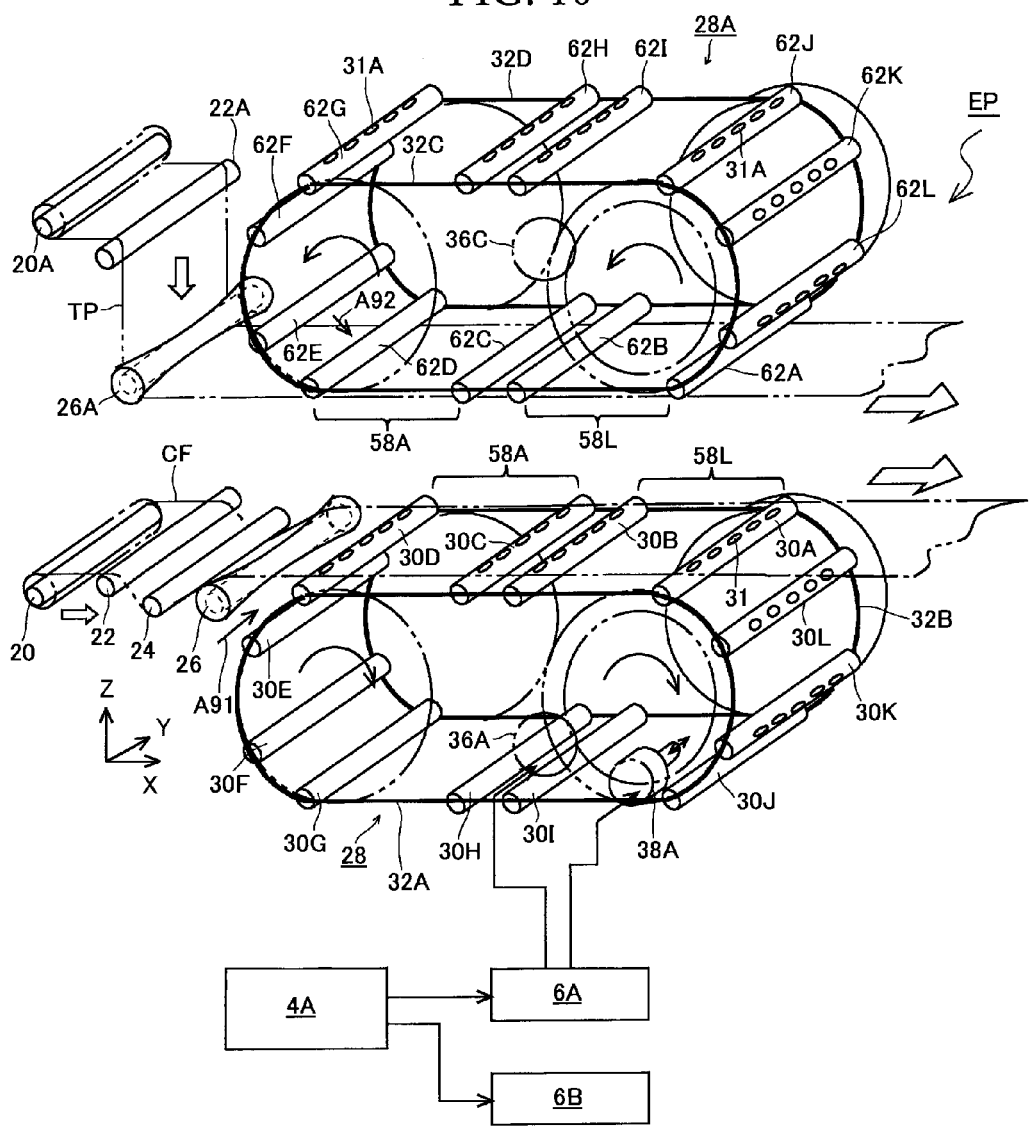
FIG. 10 is a perspective view showing the structure of the ladder type stage apparatuses shown in FIG. 9.

Next, a second embodiment of the invention will be described with reference to FIGS. 9 and 10. In the present embodiment, the invention is applied to a roll member paneling apparatus EP which continuously adheres a sheet-shaped (belt-shaped) flexible color filter CF and a TFT substrate TP which is a sheet-shaped flexible TFT (thin-film transistor) substrate. In FIGS. 9 and 10, the same or similar symbols are used for portions corresponding to those in FIGS. 1 to 3B and a detailed description thereof is omitted.

FIG. 9 shows the roll member paneling apparatus EP of the present embodiment, while FIG. 10 shows the structure of ladder type stage apparatuses 28 and 28A shown in FIG. 9. Note that the gap (interval) between the ladder type stage apparatuses 28 and 28A in the Z direction shown in FIG. 10 is larger than the actual gap. Furthermore, in FIG. 9, the gap between the ladder type stage apparatuses 28 and 28A in the Z direction is set to a gap whereby the color filter CF and the TFT substrate TP located between them are almost in mutual contact.

In FIG. 9, the roll member paneling apparatus EP includes a first moving apparatus that moves the color filter CF continuously in the +X direction; a second moving apparatus that moves the TFT substrate TP continuously in the +X direction so that it faces the color filter CF; an adhesive agent applying apparatus 64 that applies, for example, a thermosetting adhesive agent LQ onto the color filter CF; alignment systems 52A and 52B that detect the positions of alignment marks (not shown) that are formed in the respective device areas of the color filter CF; alignment systems 52C and 52D that detect the positions of alignment marks (not shown) that are formed in the respective device areas of the TFT substrate TP; a heating apparatus 71 that emits infrared rays or the like in order to cure the adhesive agent LQ; and a cutting apparatus 68 and support base 66 that cut (cut off) portions which correspond to one device area of the mutually adhered color filter CF and TFT substrate TP.

This first moving apparatus includes a supply roller 20 that supplies the color filter CF; a roller 22 that changes the direction of the color filter CF; an air guide 24 that controls the tension of the color filter CF; a ladder type stage apparatus 28 that holds the color filter CF by suction and moves it in the +X direction; and a drum-shaped roll guide 26 that transfers the color filter CF from the air guide 24 to the ladder type stage apparatus 28. As is shown in FIG. 10, the structure of the ladder type stage apparatus 28 is the same as in the first embodiment (FIG. 1), and the operation thereof is controlled by a first stage control unit 6A.

The second moving apparatus includes a supply roller 20A that supplies the TFT substrate TP; a roller 22A that changes the direction of the TFT substrate TP; a ladder type stage apparatus 28A that holds the TFT substrate TP by suction and moves it in the +X direction; and a drum-shaped roll guide 26A that transfers the TFT substrate TP from the roller 22A to the ladder type stage substrate 28A. The shape of the drum-shaped roll guide 26A is the same as the shape of the drum-shaped roll guide 26. Note that there is a tendency for the TFT substrate TP to sag down in the −Z direction. However, because it is supported by the color filter CF, slackness therein is extremely small. In order to reduce this slackness even further, it is also possible, for example, to dispose an air guide or the like for tension adjustment between the roller 22A and the drum-shaped roll guide 26A.

As is shown in FIG. 10, in the same way as in the ladder type stage apparatus 28, in the ladder type stage apparatus 28A, a plurality (here, 12) of rods 62A to 62L, in each of which are formed suction holes 31A, are joined between two chains 32C and 32D, and by rotating the chains 32C and 32D by drive motors 36C and 36D (36D is not shown), the plurality of rods from among the rods 62A to 62L that are holding the TFT substrate TP by suction from the top surface side thereof are moved in the +X direction. However, because the drive section 38A for position adjustment in the Y direction is provided on the ladder type stage apparatus 28 side, it is not necessary to provide a position adjustment mechanism for the Y direction on the ladder type stage apparatus 28A side. Operations of the ladder type stage apparatus 28A are controlled by a second stage control unit 6B, and the stage control units 6A and 6B are controlled by the main control unit 4A.

In FIG. 9, for example, the adhesive agent applying apparatus 64 is located above a portion between the drum-shaped roll guide 26 and the ladder type stage apparatus 28. The alignment systems 52A and 52B and the alignment systems 52C and 52D are located respectively inside the chains 32A and 32B and the chains 32C and 32D. The heating apparatus 71 is located inside of the chains 32C and 32D, and the cutting apparatus 68 is located immediately after the end portion in the +X direction of the ladder type stage apparatuses 28 and 28A. In this case, an area extending in the +X direction for substantially the length of one device area from the detection areas of the alignment systems 52A and 52B and the alignment systems 52C and 52D forms the alignment area 58A, and an area extending in the X direction for substantially the length of one device area forms an adhesion area 58L including an area onto which infrared rays are irradiated by the heating apparatus 71.

In the roll member paneling apparatus EP of the present embodiment, in FIG. 10, the color filter CF and the TFT substrate TP which are supplied from the supply rollers 20 and 20A are transferred to the rods 30A to 30L which move in the direction shown by the arrow A91 and the rods 62A to 62L which move in the direction shown by the arrow A92 of the ladder type stage apparatuses 28 and 28A from the center portions thereof via the drum-shaped roll guides 26 and 26A, respectively. Accordingly, no distortion or the like is generated in the color filter CF and the TFT substrate TP. Moreover, the adhesive agent LQ is applied by the adhesive agent applying apparatus 64 to a predetermined depth on the top surface of the color filter CF which has been transferred to the ladder type stage apparatus 28.

Thereafter, the position and rotation angle of the color filter CF are measured by the alignment systems 52A and 52B, and, in parallel with this, the position and rotation angle of the TFT substrate TP are measured by the alignment systems 52C and 52D. Based on the results from these detections, the alignment control section within the main control unit 4 shown in FIG. 10 calculates the amount of positional shift and the amount of rotation angle shift between the device areas of the color filter CF and the device areas of the TFT substrate TP. In addition, the stage control section within the main control unit 4 corrects, for example, the positions in the X direction and the Y direction, and the rotation angle in the θz direction of the color filter CF on the ladder type stage apparatus 28 side such that the amount of positional shift and amount of rotation angle shift thereof are corrected.

Thereafter, by irradiating infrared rays from the heating apparatus 71 onto the device areas of the color filter CF and the TFT substrate TP that have entered the adhesion area 58L from the alignment area 58A, the color filter CF and the TFT substrate TP in these device areas are adhered together. Thereafter, by using the cutting apparatus 68 to cut one device portion of the color filter CF and TFT substrate TP which has been transported out by the ladder type stage apparatuses 28 and 28A, one device portion of a display element can be manufactured.

According to the present embodiment, because the sheet-shaped color filter CF and TFT substrate TP are transported such that they are facing each other using the ladder type stage apparatuses 28 and 28A, the color filter CF and the TFT substrate TP can be transported along a target path with a high level of accuracy. Accordingly, a display element can be manufactured with a high level of accuracy.

Moreover, by forming a predetermined pattern (i.e., a circuit pattern, electrode pattern or the like) on a film-shaped substrate using the exposure apparatus EX of the above described embodiment, it is possible to obtain a large number of liquid crystal display elements as micro devices. Hereinafter, an example of this manufacturing method will be described with reference to the flowchart shown in FIG. 11.

Figure 11:
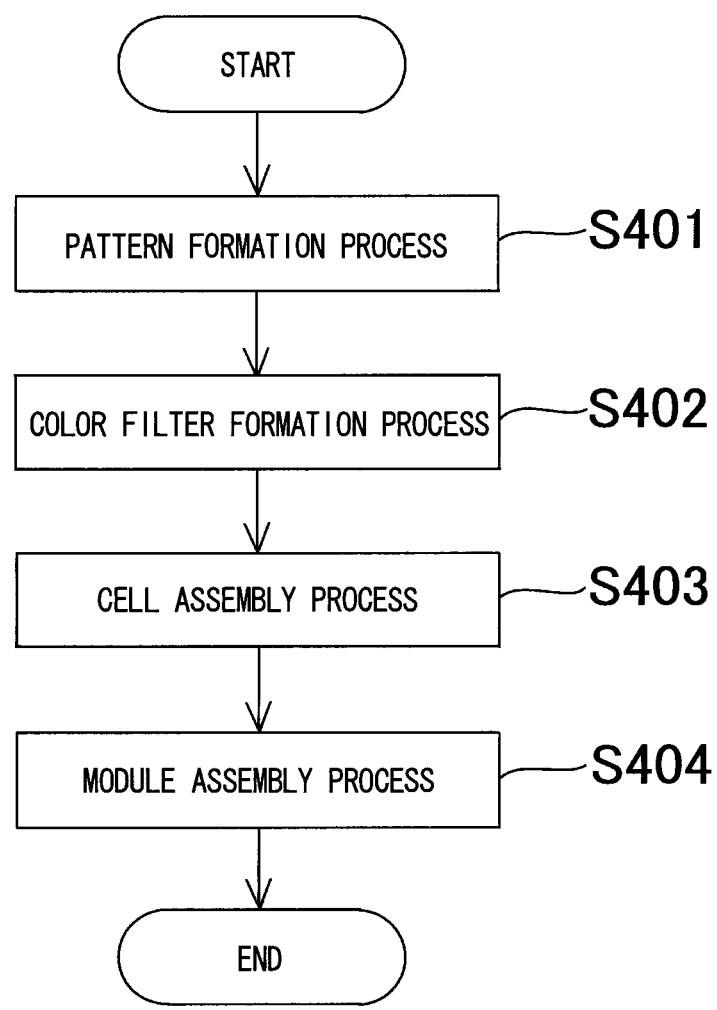
FIG. 11 is a flowchart showing an example of a microdevice manufacturing method.

In step S401 (a pattern formation process) in FIG. 11, firstly, a coating process in which a photosensitive substrate is prepared by coating photoresist onto a film-shaped substrate which is to be exposed (an exposed object); an exposure process in which the pattern of a mask for a liquid crystal display element is transferred by exposure onto a large number of pattern formation areas on this photosensitive substrate using the above described exposure apparatus; and a developing process in which this photosensitive substrate is developed are performed. By performing a lithography process which includes these coating, exposure, and developing processes, predetermined resist patterns are formed on the film-shaped substrate. After this lithography process, an etching process which uses these resist pattern as a mask, and a resist exfoliation process and the like are performed. As a result, predetermined patterns which contain a large number of electrodes or the like are formed on the film-shaped substrate. This lithography process and the like can be performed a plurality of times in accordance with the number of layers on the film-shaped substrate.

In the next step S401 (a color filter formation process), color filters are formed by arranging a large number of groups of three micro filters that correspond to red (R), green (G), and blue (B) in a matrix pattern, or by arranging a plurality of filter groups which is composed of three red R, green G, and blue B stripes in a horizontal scan line direction. In the next step S403 (a cell assembly process), liquid crystals are injected between the film-shaped substrate having predetermined patterns obtained from step S401 and the color filters obtained from step S402, for example, thereby manufacturing a liquid crystal panel (i.e., liquid crystal cells).

In the next step S404 (module assembly process), members such as electric circuits and backlights and the like that are used to perform a display operation are mounted on the large number of liquid crystal panels (i.e., liquid crystal cells) which is assembled in this manner, and the liquid crystal display elements are complete. The above described manufacturing method of liquid crystal display element includes a process in which a pattern of a mask is exposed onto a photosensitive substrate using the exposure apparatus of the above described embodiments, and a process in which the photosensitive substrates exposed by this process are processed by undergoing developing and the like. Accordingly, because exposure can be performed with high level of accuracy and efficiency, the throughput of the device manufacturing process is improved.

Moreover, in the above described embodiments, an elongated sheet-shaped member which is flexible is used as the film-shaped member to be exposed. However, as the film-shaped member, it is also possible to use rectangular plate-shaped glass plates having comparatively high rigidity which are used to manufacture liquid crystal display elements and the like, ceramic substrates which are used to manufacture thin-film magnetic heads, or circular semiconductor wafers or the like which are used to manufacture semiconductor elements.

Note that in the above described embodiment, a discharge lamp is used for the exposure light source and the necessary g-ray light, h-ray light, or i-ray light is selected. However, the present invention is not limited to this, and the present invention can still be applied in cases when light from an ultraviolet LED, laser light from a KrF excimer laser (248 nm) or an ArF excimer laser (193 nm), or a higher harmonic wave of a solid state laser (such as a semiconductor laser or the like), for example, a triple higher harmonic wave of a YAG laser (having a wavelength of 355 nm) and the like is used for the exposure light.

In this manner, the present invention is not limited to the above described embodiments, and various structures can be obtained insofar as they do not depart from the spirit or scope of the present invention.

The invention claimed is:

1. An exposure method for exposing a predetermined pattern onto a film-shaped member, the method comprising:

supporting a plurality of surface locations of the film-shaped member by a plurality of rod-shaped members while holding the film-shaped member by the rod-shaped members using suction, wherein a longitudinal direction of the rod-shaped members intersects a predetermined moving direction of the film-shaped member;

moving the rod-shaped members along with the film-shaped member in the moving direction while the rod-shaped members support the film-shaped member and hold the film-shaped member using suction;

detecting an alignment mark that is formed on the film-shaped member with an area to be exposed of the film-shaped member that is supported by the rod-shaped members; and performing alignment between the area to be exposed of the film-shaped member and the predetermined pattern based on a detection result of the alignment mark, and exposing the area to be exposed of the film-shaped member supported by the rod-shaped members which are moving in the moving direction.

2. The exposure method of claim 1,
wherein the supporting of a plurality of surface locations of the film-shaped member comprises:
moving a first and a second rod-shaped members from among the plurality of rod-shaped members sequentially to a first position on a transporting path of the film-shaped member; and
supporting a first and a second surface locations which are sequentially transported to the first position from among the plurality of surface locations by the first and second rod-shaped members respectively, and
wherein
the film-shaped member has a belt-shaped configuration; and
the moving of the film-shaped member along the transporting path comprises moving the film-shaped member in the moving direction which is parallel to an elongated direction of the belt-shaped configuration.

3. A device manufacturing method comprising:
supporting a plurality of surface locations of a film-shaped photosensitive substrate by a plurality of rod-shaped members while holding the film-shaped photosensitive substrate by the rod-shaped members using suction, wherein a longitudinal direction of the rod-shaped members intersects a predetermined moving direction of the film-shaped photosensitive substrate;
moving the rod-shaped members along with the film-shaped photosensitive substrate in the moving direction while the rod-shaped members support the film-shaped photosensitive substrate and hold the film-shaped photosensitive substrate using suction;
detecting an alignment mark that is formed on the film-shaped photosensitive substrate with an area to be exposed of the film-shaped photosensitive substrate that is supported by the rod-shaped members; and
performing alignment between the area to be exposed of the film-shaped photosensitive substrate and a predetermined pattern based on a detection result of the alignment mark;
exposing, with the predetermined pattern, the area to be exposed of the film-shaped photosensitive substrate supported by the rod-shaped members which are moving in the moving direction; and
processing the film-shaped photosensitive substrate after the exposure.

4. A device manufacturing method using an exposure apparatus which exposes a predetermined pattern onto a film-shaped substrate, the method comprising:
operating a transporting apparatus attached to the exposure apparatus, the transporting apparatus comprising:
a plurality of rod-shaped members whose longitudinal direction intersects a predetermined moving direction along a surface of the film-shaped substrate, wherein the rod-shaped members support the film-shaped substrate while holding the film-shaped substrate using suction; and
a drive unit that moves the rod-shaped members along with the film-shaped substrate in the moving direction while the rod-shaped members support the film-shaped substrate and hold the film-shaped substrate using suction,
operating a mark detection system of the exposure apparatus to detect an alignment mark formed on the film-shaped substrate, wherein the alignment mark is arranged with an area to be exposed of the film-shaped substrate that is supported by the at least one of the rod-shaped members;
operating an exposure section of the exposure apparatus to perform alignment between the area to be exposed of the film-shaped substrate and the predetermined pattern based on a detection result by the mark detection system, and to expose the area to be exposed of the film-shaped substrate supported by the at least one of rod-shaped members while moving in the moving direction; and
processing the film-shaped substrate after the exposure.

5. A device manufacturing method for exposing a device pattern image onto a film-shaped flexible substrate, the method comprising:
transporting the film-shaped flexible substrate in a moving direction while the film-shaped flexible substrate is supported by a plurality of rod-shaped members and held by the rod-shaped members using suction,
wherein a longitudinal direction of the rod-shaped members intersects the moving direction,
moving the rod-shaped members along with the film-shaped flexible substrate in the moving direction while the rod-shaped members support the film-shaped flexible substrate and hold the film-shaped flexible substrate using suction; and
exposing an area to be exposed of the flexible substrate with the device pattern image while transporting the film-shaped flexible substrate by the synchronization movement of the rod-shaped members in the moving direction.

* * * * *